United States Patent
Monson et al.

(10) Patent No.: US 9,921,003 B2
(45) Date of Patent: Mar. 20, 2018

(54) WICKLESS HEAT PIPE AND THERMAL GROUND PLANE

(71) Applicant: Lockheed Martin Corporation, Bethesda, MD (US)

(72) Inventors: Robert J. Monson, Ramsey, MN (US); Brian Van Lear, Burleson, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 548 days.

(21) Appl. No.: 13/744,608

(22) Filed: Jan. 18, 2013

(65) Prior Publication Data

US 2013/0186601 A1   Jul. 25, 2013

Related U.S. Application Data

(60) Provisional application No. 61/588,518, filed on Jan. 19, 2012.

(51) Int. Cl.
  *F28D 15/02* (2006.01)
  *H01L 23/427* (2006.01)
  *H05K 7/20* (2006.01)

(52) U.S. Cl.
  CPC ......... *F28D 15/02* (2013.01); *F28D 15/0233* (2013.01); *F28D 15/0266* (2013.01); *F28D 15/0275* (2013.01); *H01L 23/427* (2013.01); *H05K 7/20336* (2013.01); *H05K 7/20672* (2013.01); *H01L 2224/73204* (2013.01); *H01L 2224/73253* (2013.01); *H01L 2924/15311* (2013.01)

(58) Field of Classification Search
  CPC ...... F28D 15/02; F28D 15/0266; F28D 15/04; F28D 15/043; F28D 15/046; H01L 23/427

USPC ... 165/104.21, 104.26, 104.33, 104.29, 80.2, 165/80.4

See application file for complete search history.

(56) References Cited

U.S. PATENT DOCUMENTS

| 5,253,702 | A  | * | 10/1993 | Davidson et al. | 165/80.4 |
| 5,697,428 | A  | * | 12/1997 | Akachi | 165/104.21 |
| 6,164,368 | A  | * | 12/2000 | Furukawa et al. | 165/104.33 |
| 6,269,865 | B1 | * | 8/2001 | Huang | 165/104.26 |
| 7,080,680 | B2 | * | 7/2006 | Ota et al. | 165/80.2 |
| 2004/0037045 | A1 | * | 2/2004 | Phillips et al. | 361/719 |
| 2006/0146496 | A1 | * | 7/2006 | Asfia et al. | 361/700 |
| 2011/0209864 | A1 | * | 9/2011 | Figus et al. | 165/287 |

FOREIGN PATENT DOCUMENTS

JP        H04148189    *    5/1992

OTHER PUBLICATIONS

Akachi, JPH04148189TRANS (English Translation), May 1992.*

* cited by examiner

*Primary Examiner* — Justin Jonaitis
*Assistant Examiner* — Eric Ruppert
(74) *Attorney, Agent, or Firm* — Wolf, Greenfield & Sacks, P.C.

(57) ABSTRACT

A wickless heat pipe including a first tube and a second tube. The first tube may form a first shape extending longitudinally in a first direction. The second tube may form a second shape extending longitudinally in a second direction different from the first direction. The first tube and the second tube intersect at at least one location. The two tubes may intersect at a right angle or an oblique angle. The first and second tube may intersect at a plurality of locations. The tubes may be formed from a metal plate used as a thermal ground plane.

20 Claims, 6 Drawing Sheets

WICKLESS HEAT PIPE AND THERMAL GROUND PLANE

RELATED APPLICATIONS

This utility patent application claims the benefit of U.S. provisional application No. 61/588,518 titled "Wickless Thermal Ground Plane," filed on Jan. 19, 2012, which is incorporated herein by reference in its entirety.

FIELD

The techniques described herein relate generally to a wickless heat pipe and a thermal ground plane that provide high power heat dissipation.

BACKGROUND

Modern aircraft include many components that generate heat, including, but not limited to avionic electronics, radar, next generation directed-energy systems. Adequate thermal management of these components is critical to the successful operation of aircraft. When components generate a large amount of heat, the heat must be transported quickly away from the heat source in order to prevent failure of the heat producing components.

In the past, thermal management of avionic components have included air-cooling systems and liquid-cooling systems. Regardless of the type of fluid used (e.g., air or liquid), it may be challenging to deliver the fluid to the heat source, e.g., the component generating large amounts of heat. For example, avionics modules may include processors and/or integrated circuits within enclosures that make it difficult for a cooling fluid to reach the heat generating component.

To transfer the heat away from these difficult to access components, plates made from highly conductive material, such as graphite or metal, have been placed in thermal contact with the heat generating components such that the heat is carried away via conduction through the plate. However, the speed and efficiency of the heat transport in a solid plate is limited by the thermal resistance of the material.

Figure 1:
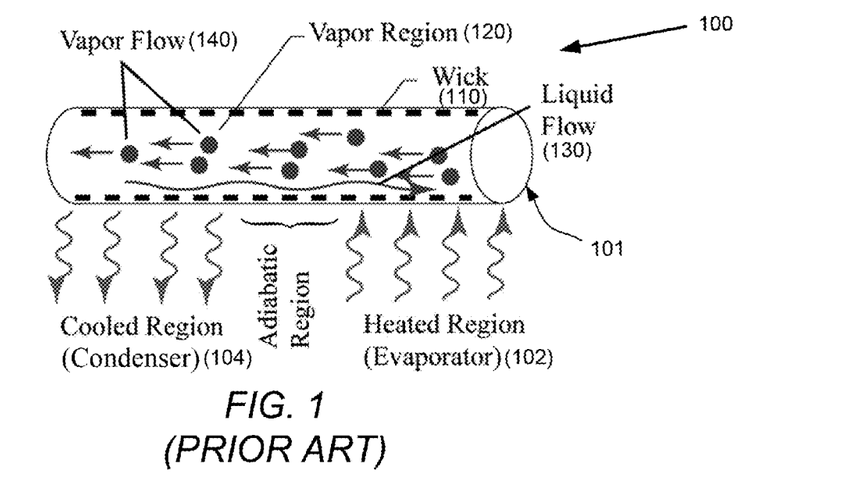
FIG. 1 illustrates a heat pipe with a wick in accordance with the prior art.

As illustrated in FIG. 1, the prior art has also employed heat pipes to transfer heat from a heated region 102 (also referred to as an evaporator region) to a cooled region 104 (also referred to as a condenser region). A traditional heat pipe 100 consists of a tube 101 with a wick 110 running along the interior surface of the tube 101. The tube 101 is filled with a liquid that evaporates into a vapor at the evaporator region 102, which then flows toward the condenser region 104 (the vapor flow is shown as 140 in FIG. 1). An internal volume of the tube 101 where the vapor may flow may be referred to as a vapor region 120. The vapor condenses back into a liquid at the condenser region 104. The wick 110 enables the condensed liquid to flow back to the evaporator region 102 for the cycle to repeat (the liquid flow is shown as 130 in FIG. 1).

While heat pipes are able to transfer a large amount of heat, a major barrier to using heat pipes in airborne environments is the tendency for heat pipes to experience "dry-out," whereby the liquid in the evaporator region 102 is fully vaporized and the wick becomes void of liquid. When dry-out occurs, the temperature of the evaporator region may rise sharply, causing catastrophic damage to the heat generating components being cooled by the heat pipe. Various aspects of the heat pipe may cause dry-out by not allowing the liquid to travel to the evaporator region 102, including wick resistance, bubble formation within the wick, and prevention of adequate wicking due to gravitation and acceleration forces.

Figure 2:
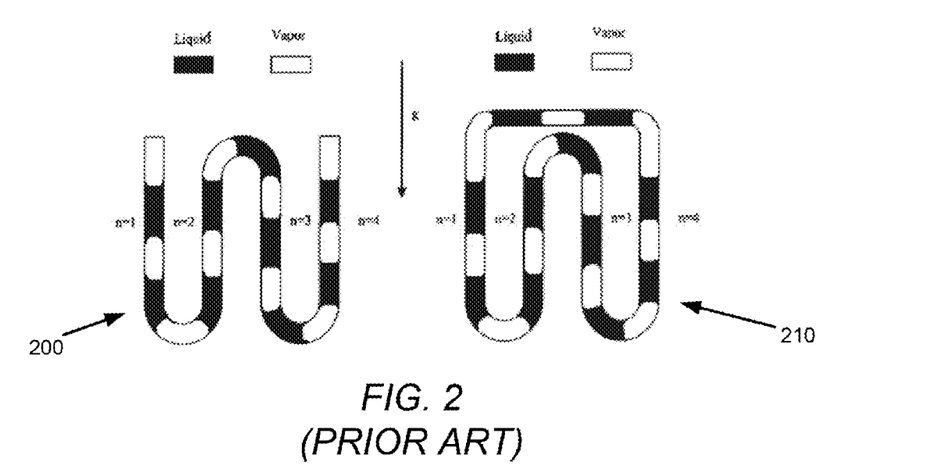
FIG. 2 illustrates an open-ended, single tube heat pipe and a closed, single tube heat pipe according to the prior art.

Removing the wick from the heat pipe eliminates some of the barriers associated with using heat pipes in avionics. It is known to use non-wicking forces to transport liquid back to the evaporator region of a heat pipe. One such technique is a oscillating heat pipe, examples of which are shown in FIG. 2. Heat pipe 200 represents an open-ended oscillating heat pipe and heat pipe 210 represents a closed oscillating heat pipe. A oscillating heat pipe includes a chamber holding a liquid, with a portion of the chamber in thermal contact with a heat source and another portion in thermal contact with a condenser. The liquid near the evaporator boils and evaporates, producing a vapor bubble in the chamber. As the vapor bubble expands, the pressure within the bubble increases such that it pushes the liquid, creating a nascent flow of the liquid. When the bubble reaches the condenser region, the vapor bubble (also referred to as a "slug") condenses and the pressure drops. A reverse liquid flow commences whereby liquid flows to the evaporator region. The process repeats and an oscillatory fluid motion is achieved.

BRIEF SUMMARY OF INVENTION

Some embodiments are directed to a wickless heat pipe including a first tube and a second tube. The first tube may form a first shape extending longitudinally in a first direction. The second tube may form a second shape extending longitudinally in a second direction different from the first direction. The first tube and the second tube intersect at at least one location. The two tubes may intersect at a right angle or an oblique angle. The first and second tube may intersect at a plurality of locations.

In some embodiments, an internal volume of the wickless heat pipe is partially filled with a liquid. The internal volume of the wickless heat pipe may be filled more than 50% with the liquid. The internal volume of the wickless heat pipe may also be filled approximately 70% with the liquid. The liquid may be water and/or alcohol.

In some embodiments, the first tube is one of a plurality of tubes extending longitudinally in the first direction and the second tube is one of a plurality of tubes extending longitudinally in the second direction. Each of the plurality of tubes extending longitudinally in the first direction may intersect at at least one location with each of the plurality of tubes extending longitudinally in the second direction.

In some embodiments, the first tube and the second tube are formed within a metal plate. The metal plate may be part of a module cover that is configured to be in thermal contact with an integrated circuit and/or processor. The module cover may also be in thermal contact with a card chassis. The integrated circuit and/or processor may be part of an avionics module.

In some embodiments, the first tube and the second tube are formed from a metallic material. The metallic material may be aluminum or copper.

In some embodiments, the first and second tube have a circular cross-section. The first tube and second tube may be approximately one millimeter in diameter.

In some embodiments, the first shape and the second shape are the same shape. The shape may be rectangular. The first rectangular shape may be a different size than the second rectangular shape.

Some embodiments are directed to a wickless heat pipe including from a plurality of tubes that form an internal volume. A plurality of intersections are formed where two of the plurality of tubes intersect. The internal volume of the heat pipe is at least partially filled with a liquid. The plurality of tubes and plurality of intersections form a plurality of paths that, when at least a portion of the liquid is heated to produce a vapor, maintain a flow of the vapor within the heat pipe.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized and appreciated that dry-out remains a problem in oscillating heat pipes. Vapor bubbles may remain at the evaporator region for too long of a time period, resulting in very high temperatures. If the pressure of the slug is not sufficient to push the liquid away, no flow occurs and dry-out results. It may also be challenging to maintain the oscillatory fluid motion once it begins. The viscous forces of the liquid dampen the oscillations, resulting in the fluid motion ceasing.

The inventors have also recognized and appreciated that when a heat pipe as a serpentine shape, as illustrated in FIG. 2, there is only one possible path for vapor to follow. The heated regions of the heat pipe may be arranged such that, for example, there is no condenser region between two heated regions. When this type of heat distribution occurs, stagnation occurs and dry-out may result. For example, if the heat pipe 200 was heated horizontally across the middle of the serpentine shape and condenser regions only existed across the top of the serpentine shape, stagnation would result in the "u-turns" at the bottom of the heat pipe 200 because there is no condenser region for the vapor to flow towards.

The inventors have also recognized and appreciated gravitational forces and/or acceleration of a vehicle carrying the heat pipe remain a problem for oscillating heat pipes and that a novel design of the components for an oscillating heat pipe, described herein, may prevent dry-out and maintain self-sustaining oscillation and fluid flow regardless of the orientation and acceleration of the aircraft.

FIG. 2 illustrates oscillating heat pipes according to the prior art. A serpentine tube arrangement is used with, e.g., four tube sections oriented parallel to the gravitational field, represented by arrow g. Vapor bubbles ("slugs") are created amongst pockets of liquid ("plugs") by a heat source (not shown). Both open-ended heat pipe 200 and closed heat pipe 210 utilize a single, continuous tube with no intersections. The heat pipes 200 and 210 extend longitudinally in a direction parallel to the gravitational field. When the aircraft is oriented in a manner such that the heat pipes 200 and 210 extend longitudinally in a direction not parallel to the gravitational field gravitational field or the aircraft accelerates such that apparent forces are created such that the heat pipes 200 and 210 extend longitudinally in a direction not parallel to the apparent forces, operation of the heat pipes 200 and 210 may fail.

Figure 3A:
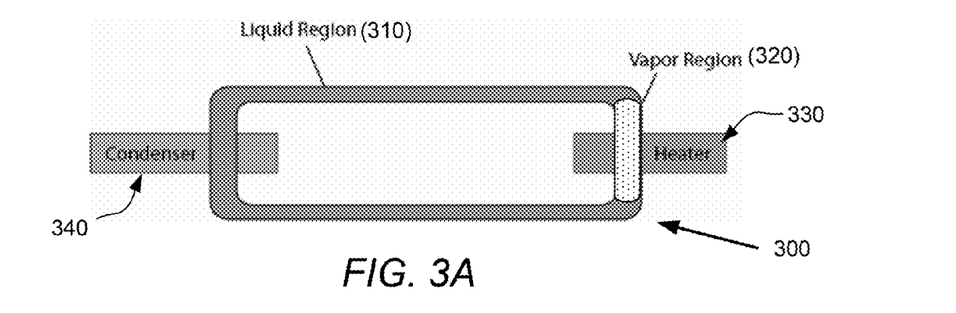
FIG. 3A illustrates a wickless heat pipe with a large, static vapor region.
Figure 3B:
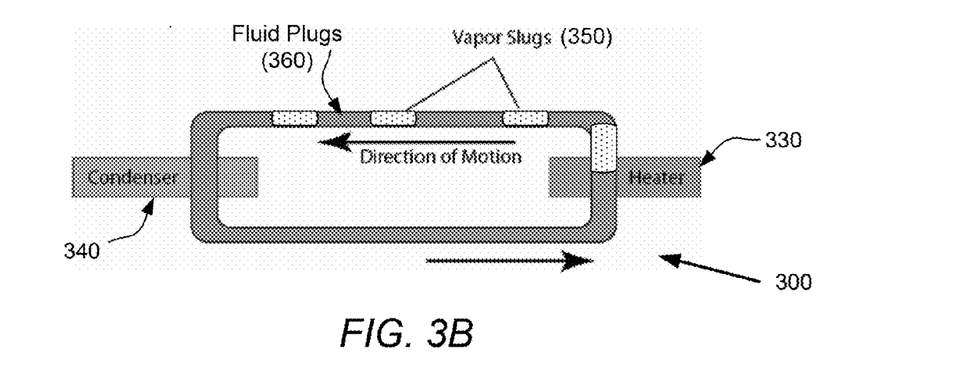
FIG. 3B illustrates a wickless heat pipe with a desired vapor flow.

FIG. 3A illustrates a wickless heat pipe 300 with a rectangular shape, extending longitudinally in one direction. One end of the heat pipe 300 is in thermal contact with a heater 330 and the other end of the heat pipe is in contact with a condenser 340. The heat pipe is a rounded pipe that is partially filled with a liquid, forming a liquid region 310. The heater 330 causes a portion of the liquid to evaporate, forming a vapor region 320. FIG. 3A illustrates a problem that arises, where the vapor region 320 grows too large and does not cause the liquid to flow. If liquid flow is not achieved, the portion of the heat pipe 300 in contact with the heater will not cool the heater 330, and overheating may occur. FIG. 3B illustrates the wickless heat pipe 300 with the desired self-sustaining flow of vapor slugs 350 and fluid plugs 360.

The inventors have recognized and appreciated that by using a wickless heat pipe comprising two or more tubes that intersect at one or more location, the a self-sustaining flow may be achieved and dry-out may be prevented. By providing a plurality of paths for the vapor to follow, stagnation may occur in one of the paths, but the vapor will continue to flow in the alternative paths. Stagnation in all possible paths is prevented as long as there is a path between an evaporator region and a condenser region. Moreover, such an arrangement of intersecting tubes allows for dynamic adjustment of the vapor flow within the heat pipe depending on the various conditions experienced at a particular time. For example, the heat distribution may change or the g-forces experienced by the heat pipe may change. By providing a plurality of paths for the vapor to flow, the heat pipe may passively adjust to the current environment and continue transporting heat away from the heat producing regions.

In some embodiments, the tubes of the heat pipe may be embedded within a thermal ground plane. The thermal ground plane may be part of a module cover for an avionics module, where the module cover is in thermal contact with a heat generating component, such as a processor or integrated circuit. In some embodiments, the module cover may also be in thermal contact with a chassis that holds a plurality of avionics modules.

Figure 4:
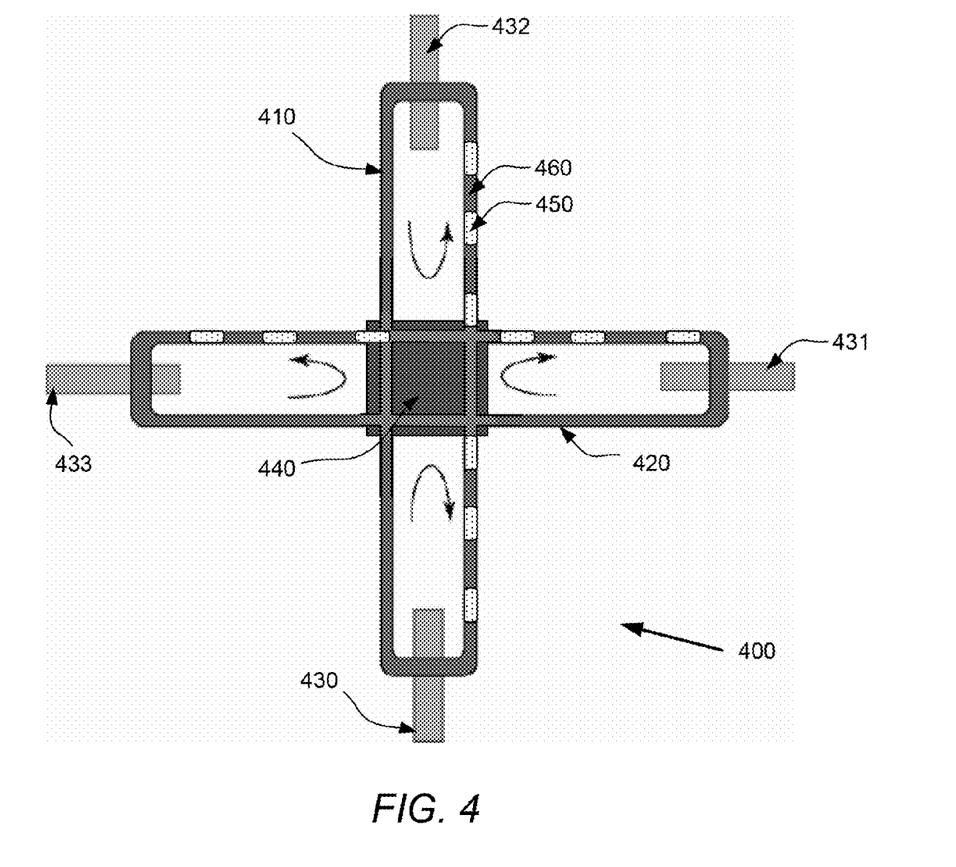
FIG. 4 illustrates a wickless heat pipe comprising two intersecting tubes.

FIG. 4 illustrates an embodiment of a wickless heat pipe 400 comprising a first tube 410 and a second tube 420. However, any suitable tube shape may be used. The first tube 410 and the second tube 420 illustrated in FIG. 4 are both rectangular in shape. In some embodiments, the tubes may be triangular in shape or any other suitable polygonal shape. In some embodiments, the first tube 410 may have the same shape as the second tube 420. In other embodiments, the two tubes 410 and 420 may have different shapes. The tubes used to form heat pipe 400 may have any suitable cross-sectional shape and size. In some embodiments, the tubes may have cross-sections of a rounded shape with no corners. For example, the tubes may be circular or elliptical. In other embodiments, the tubes may have a square or rectangular cross-section. The cross-sectional size of the tube may be any suitable size. For example, a circular tube with approximately a one millimeter diameter may be used. In other embodiments, a tube with a cross-sectional diameter less than one millimeter may be used. However, embodiments are not so limited. The diameter of the tubes may depend on various properties of the liquid used. For example, the diameter of the tubes used in the heat pipe may be determined based on a number of factors, such as: the ratio of viscous to inertial forces of the liquid, the operation temperature, the internal pressure of the heat pipe, and the g-forces required to sustain an optimized fluid flow in an oscillating matter. In some embodiments, the cross-sectional area of the first tube 410 may differ from the cross-sectional area of a second tube 420. For example, the cross-sectional area of the first tube 410 may be larger than the cross-sectional area of the second tube 420.

The heat pipe 400 is arranged such that the first tube 410 extends longitudinally in a first direction and the second tube 420 extends longitudinally in a second direction. Embodiments are not limited to any particular orientation of the tubes. In some embodiments, the first direction is perpendicular to the second direction such that the long side of the two tubes are perpendicular. The first tube 410 and the second tube 420 intersect at four different locations. In heat pipe 400, the tubes intersect at right angles such that, at each intersection, the first tube 410 is perpendicular to the second tube 420. In other embodiments, the first direction may be arranged at an non-perpendicular angle with respect to the second direction such that the tubes intersect at angles other than right angles. Also, the first tube 410 and the second tube 420 may intersect at any number of locations. In some embodiments, there may be more than four intersection locations. In other embodiments, the tubes may intersect at fewer than four locations.

The two intersecting tubes 410 and 420 form an enclosed volume, referred to as an internal volume. The internal volume is preferably airtight to prevent any liquid from leaking in or out of the heat pipe 400. The internal volume may be partially or entirely filled with a liquid 460. Any liquid that has a suitable boiling point to form vapor within the internal volume of the heat pipe may be used. In some embodiments, a liquid with a two-phase state at the operating temperature of the device being cooled may be used. For example, water, paraffin, alcohol or a combination thereof may be used. In some embodiments, at least 50% of the internal volume of the heat pipe may be filled with the liquid 460. In some embodiments, approximately 70% of the internal volume of the heat pipe may be filled with liquid 460. In some embodiments, the portion of the internal volume that is not filled with liquid 460 may be evacuated such that there is no air or other gas present within the internal volume of heat pipe 400.

The heat pipe 400 is arranged with a heat producing region 440 at the center of the heat pipe 400 and a plurality of condenser regions 430-433 at the distal portions of the first tube 410 and the second tube 420. Embodiments are not so limited. Any suitable number of heat producing regions or condenser regions may be used. By having a heat producing region at the center, which is in thermal contact with both the first tube 410 and the second tube 420, a plurality of vapor flows are possible. The arrows of FIG. 4 illustrate possible vapor flow directions in each of the four arms extending from the center of the heat pipe 400. By providing a plurality of paths for vapor slugs 450 to follow, regardless of the orientation or acceleration of the aircraft housing the heat pipe 400, gravity and/or acceleration forces will promote vapor flow in at least one of the four loops. Accordingly, the likelihood of dry-out may be substantially reduced and the flow in all four arms of the heat pipe may not stagnate simultaneously.

The first tube 410 and the second tube 420 may be made from any suitable material. Preferably the material should have a high thermal conductance. For example, the tubes may be made from a metallic material such as copper, aluminum or a metallic alloy. In some embodiments the tubes 410 and 420 may be formed within a plate forming a thermal ground plane.

The tubes 410 and 420 may be in thermal contact with the heat producing region 440 and the condenser regions 430-433 in any suitable way. In some embodiments, the tubes 410 and 420 may be in direct contact with the heat producing region 440 and the condenser regions 430-433. In other embodiments, a thermal interface material, such as a thermal grease or a thermal pad, may be used between the heat producing region 440 and the tubes 410 and 420.

Figure 5:
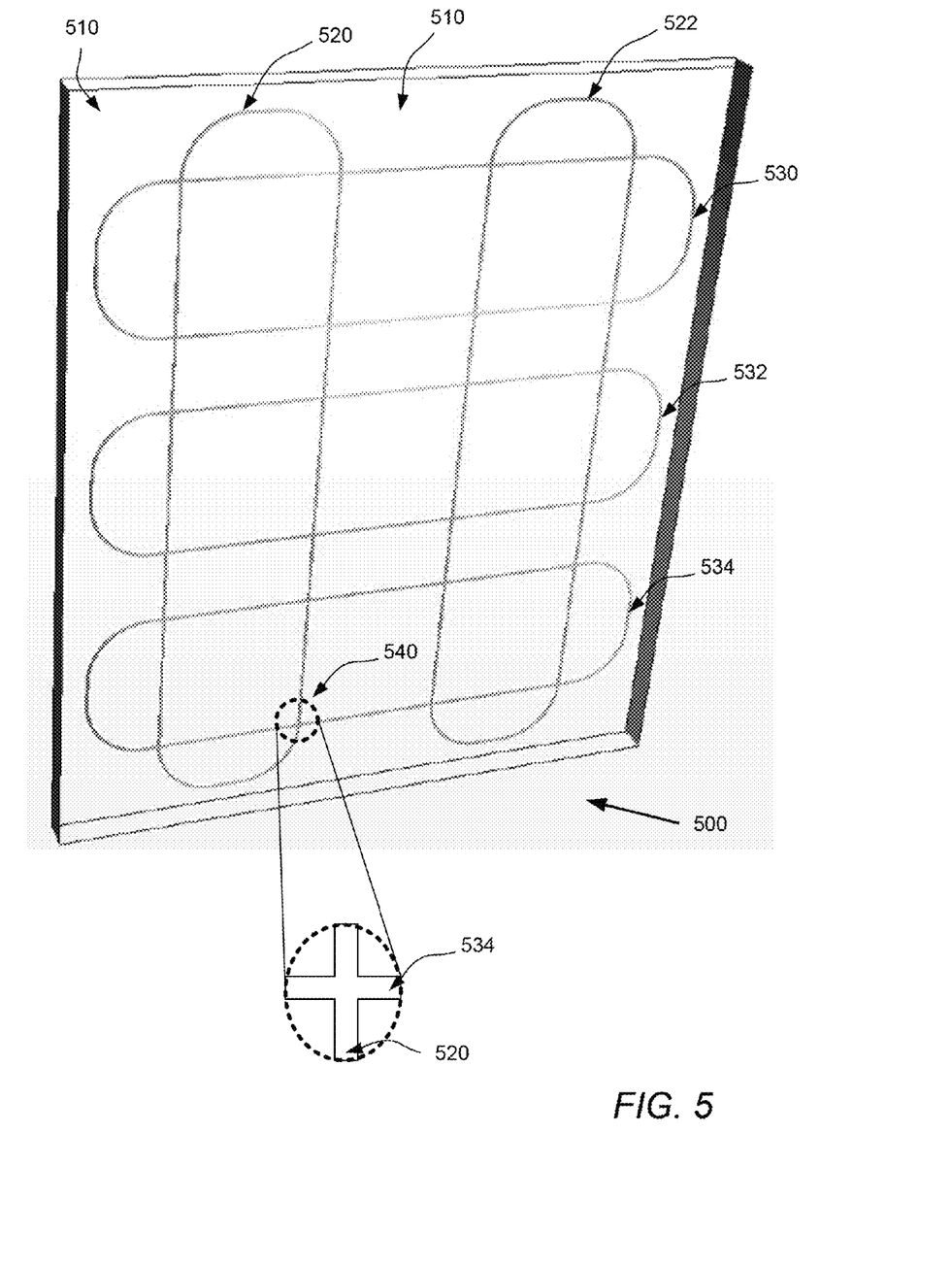
FIG. 5 illustrates a wickless heat pipe comprising a plurality of intersecting tubes.

FIG. 5 illustrates an additional embodiment of a wickless heat pipe 500. Heat pipe 500 comprises a plurality of tubes, which may be any number of tubes. FIG. 5 illustrates a first tube 520 and a second tube 522 oriented parallel to one another, extending longitudinally in a first direction, and a third tube 530, a fourth tube 532 and a fifth tube 534 oriented parallel to one another, but perpendicular to the first tube 520 and the second tube 522 such that they extend longitudinally in a second direction.

The tubes of heat pipe 500 are formed within a thermal ground plane 510, which may be formed from a metallic material. Any suitable number of tubes may be used. For example the tubes may be spaced such that the thermal ground plane 510 is sufficiently filled with tubes such that no hot spots may be formed.

FIG. 5 illustrates an inset showing one of the intersection 540 between the first tube 520 and the fifth tube 534. The tubes of heat pipe 500 intersect such that vapor slugs may flow in any direction when they reach the intersection. Which direction a vapor slug flows may depend on a variety of conditions, including the location of heat sources, the location of condenser regions, the orientation of the heat pipe 500 within a gravitational field, and the orientation of the heat pipe 500 with respect to the acceleration experienced by the heat pipe 500 when it is in an aircraft.

Figure 6A:
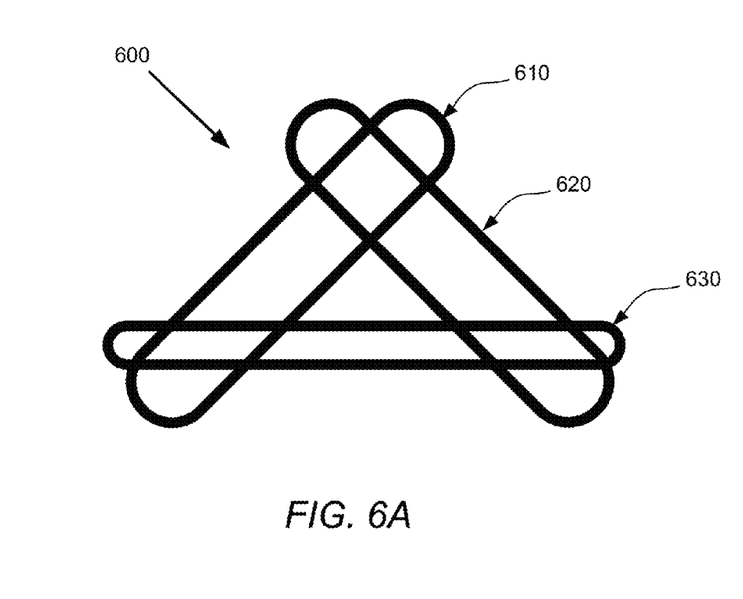
FIG. 6A illustrates a triangular wickless heat pipe.
Figure 6B:
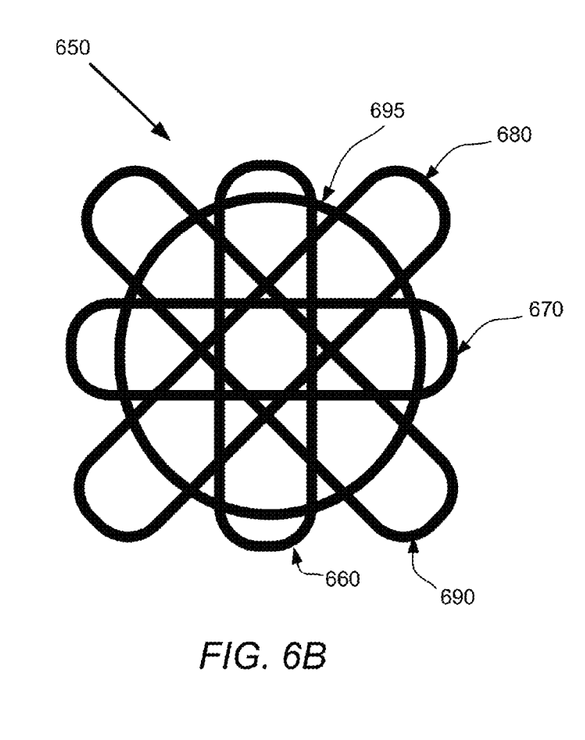
FIG. 6B illustrates a wickless heat pipe with an alternative arrangement of tubes.

FIG. 6A and FIG. 6B illustrate alternative arrangements of a plurality of tubes that may be used in wickless heat pipes in accordance with some embodiments. Any suitable arrangement of tubes may be used. For example, the heat pipe 600 of FIG. 6A illustrates an triangular arrangement of three tubes. The first tube 610, the second tube 620 and the third tube 630 intersect each of the other tubes in a plurality of locations. The first tube 610 intersects the second tube 620 at a right angle, whereas the third tube 630 intersects both the first tube 610 and the second tube 620 at oblique angles. Also, while each of the tubes is rectangular in shape, the third tube 630 is a different size rectangle than the other tubes. Specifically, the width of the rectangle is smaller than the other two rectangles.

FIG. 6B illustrates an embodiment of a heat pipe 650 comprising four rectangular tubes and an outer circular tube 695. A first tube 660 intersects a second tube 670 at four locations at right angles. A third tube 680 and a fourth tube 690 also intersect at four locations at right angles. The first tube 660 and the second tube 670 each intersect the third tube 680 and the fourth tube 690 at oblique angles. At each of the intersections, the vapor and liquid filling the internal volume of the heat pipe may flow in any direction. An outer circular tube 695 intersects the four rectangular tubes near a distal portion of each of the tubes. Without the outer circular tube 695, stagnation may result in the distal portions of the rectangular tubes. The outer circular tube 695 provides an additional path for the vapor to flow to prevent such stagnation.

Figure 7:
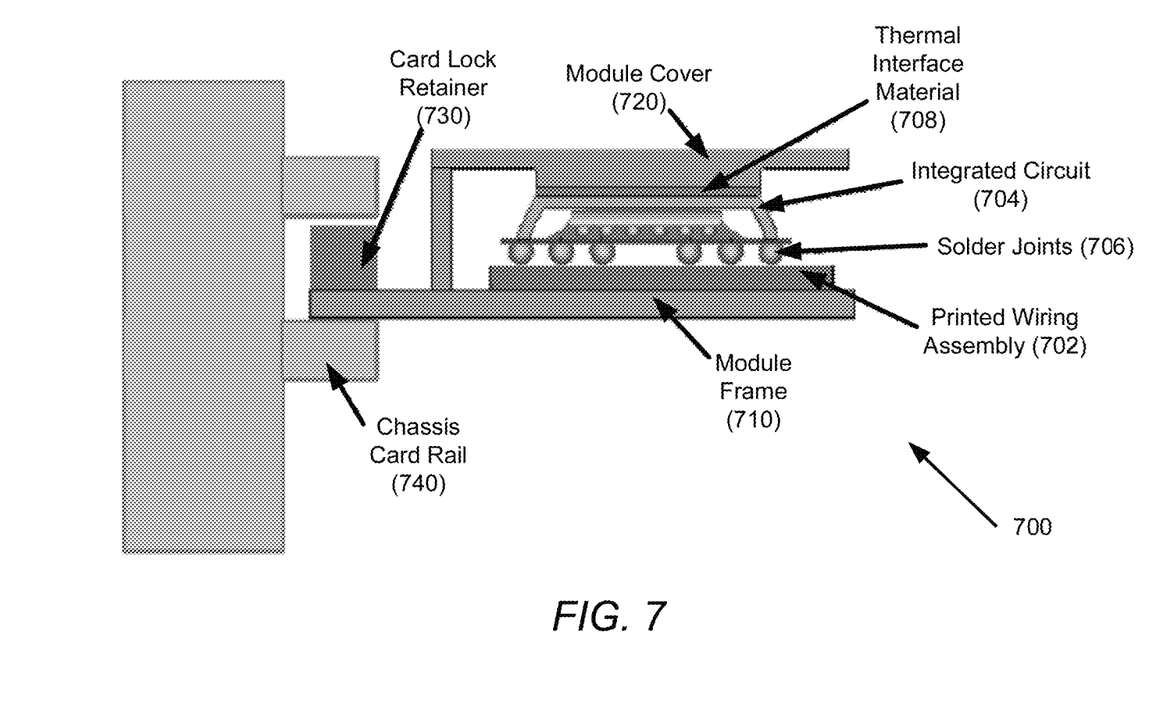
FIG. 7 illustrates a close up cross-section of the first mezzanine card assembly.

FIG. 7 illustrates an avionics module 700 according to some embodiments. The avionics module 700 includes a module frame 710 that supports a printed wiring assembly 702. Components, such as integrated circuit 704, are electrically connected to the printed wiring assembly 702 via solder joints 706. A module cover 720 includes a wickless heat pipe (not shown) in accordance with any of the aforementioned embodiments or variations thereof. A card lock retainer 730 holds the avionics module 700 in a chassis card rail 740. The module cover 720 is in thermal contact with the integrated circuit 704 via thermal interface material 708. The heat pipe of the module cover 720 transports heat generated by the integrated circuit 704 to the chassis card rail 740 via the module frame. The chassis may further dissipate the transported heat using techniques known in the art.

Having thus described several aspects of at least one embodiment of this invention, it is to be appreciated that various alterations, modifications, and improvements will readily occur to those skilled in the art. For example, in any of the above embodiments, the heater and condenser may be in any suitable location. There may also be any number of heater and condenser regions. In some embodiments, it may not be known where a heat generating region will occur at any particular time.

Moreover, any aspect of a particular embodiment described above may be combined with one or more aspects of any other embodiment described above. For example, the materials used to form the heat pipe 400 of FIG. 4 may also be used to create a heat pipe 650 formed in accordance with FIG. 6.

Such alterations, modifications, and improvements are intended to be part of this disclosure, and are intended to be within the spirit and scope of the invention. Accordingly, the foregoing description and drawings are by way of example only.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A wickless heat pipe comprising:
   a first tube forming a first shape extending longitudinally in a first direction; and
   a second tube forming a second shape extending longitudinally in a second direction different from the first direction, wherein the first tube and the second tube intersect at at least one location such that the first tube and the second tube are fluidically connected,
   the first shape comprising a first oval enclosed other than at the at least one location,
   the second shape comprising a second oval enclosed other than at the at least one location,
   the first oval comprising a first portion distal from the second oval,
   the second oval comprising a second portion distal from the first oval,
   wherein a plurality of heat producing regions are in thermal contact with the first tube and the second tube.

2. The wickless heat pipe of claim 1, wherein the first tube intersects the second tube at a right angle.

3. The wickless heat pipe of claim 1, wherein the first tube intersects the second tube at a plurality of locations, the first oval includes a first major axis of symmetry, and the second oval includes a second major axis of symmetry.

4. The wickless heat pipe of claim 1, wherein an internal volume of the wickless heat pipe is partially filled with a liquid.

5. The wickless heat pipe of claim 4, wherein the internal volume of the wickless heat pipe is filled more than 50% with the liquid.

6. The wickless heat pipe of claim 5, wherein the internal volume of the wickless heat pipe is filled 70% with the liquid.

7. The wickless heat pipe of claim 4, wherein the liquid comprises water and/or alcohol.

8. The wickless heat pipe of claim 1, wherein:
   the first tube is one of a plurality of tubes extending longitudinally in the first direction; and
   the second tube is one of a plurality of tubes extending longitudinally in the second direction.

9. The wickless heat pipe of claim 8, wherein:
   each of the plurality of tubes extending longitudinally in the first direction intersect at at least one location with each of the plurality of tubes extending longitudinally in the second direction.

10. The wickless heat pipe of claim 1, wherein the first tube and the second tube are formed within a thermally conductive plate.

11. The wickless heat pipe of claim 10, wherein the thermally conductive plate is part of a module cover, wherein the module cover is configured to be in thermal contact with an integrated circuit and/or processor.

12. The wickless heat pipe of claim 11, wherein the module cover is configured to be in thermal contact with a card chassis.

13. The wickless heat pipe of claim 11, wherein the integrated circuit and/or processor is part of an avionics module.

14. The wickless heat pipe of claim 1, wherein the first tube and the second tube are formed from a metallic material.

15. The wickless heat pipe of claim 14, wherein the metallic material is aluminum or copper.

16. The wickless heat pipe of claim 1, wherein the first tube has a circular cross-section and the second tube has a circular cross-section.

17. The wickless heat pipe of claim 1, wherein the first shape and the second shape are of a rectangular oval shape.

18. The wickless heat pipe of claim 17, wherein the first rectangular oval shape is a different size than the second rectangular oval shape.

19. A wickless heat pipe comprising:
a plurality of tubes forming a first oval and a second oval that form an enclosed internal volume, the first oval having a first distal portion protruding beyond the second oval, the second oval having a second distal portion protruding beyond the first oval;
a plurality of intersections, each of the plurality of intersections being formed where two of the plurality of tubes intersect; and
a liquid within the internal volume,
wherein the plurality of tubes and plurality of intersections form a plurality of paths that, when at least a portion of the liquid is heated to produce a vapor as a result of the plurality of tubes being in thermal contact with a plurality of heat producing regions, maintain a flow of the vapor within the heat pipe.

20. The wickless heat pipe of claim 19, wherein at least a portion of the plurality of intersections are where two of the plurality of tubes intersect at right angles, the first oval includes a first major axis of symmetry, and the second oval includes a second major axis of symmetry.

* * * * *